United States Patent
Chang et al.

(10) Patent No.: US 9,564,513 B2
(45) Date of Patent: Feb. 7, 2017

(54) EPITAXY IN SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Shih-Chieh Chang, Taipei (TW); Ying-Min Chou, Tainan (TW); Yi-Ming Huang, Tainan (TW); Chun-Ju Huang, Chiayi (TW); Huai-Tei Yang, Hsin-Chu (TW); Kei-Wei Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 15 days.

(21) Appl. No.: 14/180,674

(22) Filed: Feb. 14, 2014

(65) Prior Publication Data
US 2015/0236124 A1    Aug. 20, 2015

(51) Int. Cl.
| H01L 29/66 | (2006.01) |
| H01L 29/08 | (2006.01) |
| H01L 29/78 | (2006.01) |
| H01L 21/02 | (2006.01) |

(52) U.S. Cl.
CPC ..... *H01L 29/66636* (2013.01); *H01L 21/0262* (2013.01); *H01L 21/02532* (2013.01); *H01L 21/02576* (2013.01); *H01L 21/02579* (2013.01); *H01L 21/02639* (2013.01); *H01L 29/0847* (2013.01); *H01L 29/66628* (2013.01); *H01L 29/66795* (2013.01); *H01L 29/7853* (2013.01); *H01L 29/7834* (2013.01)

(58) Field of Classification Search
CPC ............... H01L 29/66636; H01L 29/78; H01L 21/02576; H01L 21/02532; H01L 21/02579; H01L 21/02639; H01L 21/0262; H01L 29/66628; H01L 29/7834
See application file for complete search history.

(56) References Cited

U.S. PATENT DOCUMENTS

| 2011/0073952 A1* | 3/2011 | Kwok | H01L 29/045 257/368 |
| 2011/0287611 A1* | 11/2011 | Cheng | H01L 21/02532 438/478 |
| 2012/0299121 A1* | 11/2012 | Wu | H01L 21/2257 257/408 |

* cited by examiner

*Primary Examiner* — Yuanda Zhang
*Assistant Examiner* — Michael Carter
(74) *Attorney, Agent, or Firm* — Chun-Ming Shih

(57) ABSTRACT

A semiconductor structure including a semiconductor substrate is provided. The semiconductor substrate includes a surface. A gate structure is provided on the surface. An interface lower than the surface is provided. An epitaxial regrowth region adjacent the gate structure is disposed on the interface. In addition, the epitaxial regrowth region extends over the surface and includes a bottom layer and a cap layer. The activation of the cap layer is lower than that of the bottom layer. Moreover, the bottom layer is lower than the surface and the gate structure. Furthermore, the bottom layer includes a first downwardly-curved edge and a second downwardly-curved edge over the first one. The first downwardly-curved edge is connected with the second downwardly-curved edge at two endpoints. The two endpoints are in contact with the surface of the semiconductor substrate.

20 Claims, 12 Drawing Sheets

EPITAXY IN SEMICONDUCTOR STRUCTURE AND MANUFACTURING METHOD THEREOF

BACKGROUND

The semiconductor integrated circuits (IC) industry has experienced exponential growth. With such growth, technological advances in IC materials and designs have produced generations of ICs where each generation has smaller and more complex circuits than the previous generation. As a result, more complex circuits require more sophisticated manufacturing/processing methods of etching, deposition, and so on. A variety of methods are used in the semiconductor manufacturing industry to deposit materials onto surfaces. One of the most widely used methods is chemical vapor deposition ("CVD"), in which atoms or molecules are contained in a vapor deposit on a surface in order to form a film. CVD allows for the growth of films on device surface areas, including "epitaxial" films comprised of a crystalline silicon-containing material.

In some applications it may be desirable to achieve uniform or "blanket" deposition of epitaxial growth over mixed surfaces, such as insulating and semiconductor surfaces, while in other applications it is desirable to achieve "selective" deposition only over selected surfaces. Such selective deposition allows for growth in particular regions of an underlying structure by taking advantage of differential nucleation during deposition on different materials.

Selective deposition generally involves simultaneous deposition and etching of an epitaxial material. During a typical selective deposition process, a precursor of choice may be introduced that has a tendency to nucleate and grow more rapidly on one surface (e.g., a semiconductor surface) and less rapidly on another surface (e.g., an oxide surface). An etchant is added to the deposition process, which has a greater effect upon the poorly nucleating film as compared to the rapidly nucleating film, therefore allowing growth only on specified surface areas. The relative selectivity of a selective deposition process is tunable by adjusting factors that affect the deposition rate (for example, precursor flow rate, temperature and pressure) and the rate of etching (for example, etchant flow rate, temperature and pressure). By precise tuning, epitaxial growth may be achieved with complete (e.g., zero growth on insulators and net growth, albeit slow, on single crystal windows) or partial (e.g., net growth on insulators and single crystal windows, with the net growth on the insulator being of lesser thickness than on the single crystal windows) selectivity on desired surfaces. However, while known processes often result in selective epitaxial growth, such growth is often of poor quality. Measures to improve epitaxial growth are continuously being sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
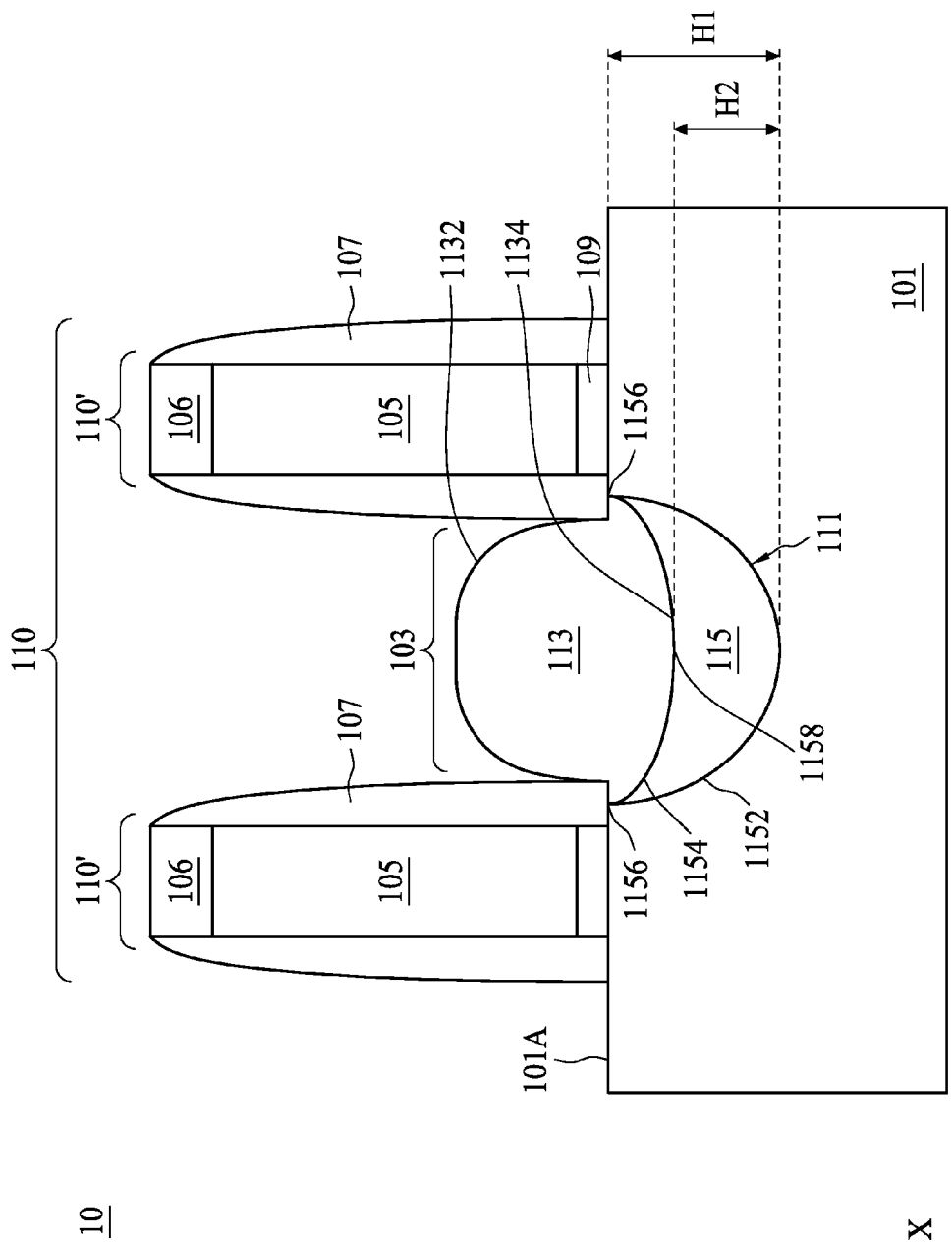
FIG. 1 is a cross sectional view of an epitaxial regrowth source/drain region between two gates of a planar transistor, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, substrate can refer either to the work piece upon which deposition is desired, or the surface exposed to one or more deposition gases. For example, in certain embodiments, the substrate is a single crystal silicon wafer, a semiconductor-on-insulator ("SOI") substrate, or an epitaxial silicon surface, a silicon germanium surface, or a III-V material deposited upon a wafer. Work pieces are not limited to wafers, but also include glass, plastic, or other substrates employed in semiconductor processing. In some embodiments, the substrate has been patterned to have two or more different types of surfaces, such as both semiconductor and insulator surfaces. Examples of insulator materials include silicon dioxide, including low dielectric constant forms, such as carbon-doped and fluorine-doped oxides of silicon, silicon nitride, metal oxide and metal silicate. In certain embodiments, silicon-containing layers are selectively formed over single crystal semiconductor materials while allowing for minimal or zero growth of material over adjacent insulators. According to some embodiments, any material growth over adjacent insulators may be amorphous or polycrystalline non-epitaxial growth.

In certain embodiments, the word "substrate" in the present disclosure represents a patterned substrate that has a first surface having a first surface morphology and a second surface having a second surface morphology. Even if surfaces are made from the same elements, the surfaces are considered different if the morphologies or crystallinity of the surfaces are different. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by an in-plane crystal structure and orientation that is identical to the substrate upon which they are grown, typically single crystal. The atoms in these materials are arranged in a lattice-like structure that persists over relatively long distances on an atomic scale. Amorphous morphology is a non-crystalline structure having a low degree of order because the atoms lack a definite periodic arrangement. Other morphologies include microcrystalline and mixtures of amorphous and crystalline material. "Non-epitaxial" thus encompasses amorphous, polycrystalline, microcrystalline and mixtures of the same. As used herein, "single-crystal" or "epitaxial" are used to describe a predominantly large crystal structure having a tolerable number of faults therein, as is commonly employed for transistor fabrication. The crystallinity of a layer generally falls along a continuum from amorphous to polycrystalline to single-crystal; a crystal structure is often considered single-crystal or epitaxial despite a low density of faults. Specific examples of patterned substrates having two or more different types of surfaces, whether due to different morphologies and/or different materials, include without limitation: single crystal/polycrystalline, single crystal/amorphous, single crystal/dielectric, conductor/dielectric, and semiconductor/dielectric.

FIG. 1 shows a cross sectional view of a planar transistor 10, for example, a MOSFET.

Referring to FIG. 1, in some embodiments, a lower portion of an epitaxial regrowth region 103 is positioned in a semiconductor substrate 101, while an upper portion of the epitaxial regrowth region 103 is protruding from a surface 101A of the semiconductor substrate 101. A gate structure 110 is disposed on the surface 101A. In certain embodiments, the gate structure 110 includes at least two gates 110' disposed on the surface 101A at two transverse ends (along X direction) of the epitaxial regrowth region 103.

In some embodiments in accordance with the present disclosure, the semiconductor substrate 101 includes silicon. Alternatively, the semiconductor substrate 101 includes germanium, silicon germanium, gallium arsenide or other appropriate semiconductor materials. Also alternatively, the semiconductor substrate 101 includes an epitaxial layer. For example, the semiconductor substrate 101 may have an epitaxial layer overlying a bulk semiconductor. Further, the semiconductor substrate 101 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such stained substrate may be formed by selective epitaxial growth (SEG). Yet alternatively, the semiconductor substrate 101 comprises an elementary semiconductor, such as silicon or germanium in a crystalline structure; a compound semiconductor, such as silicon germanium, silicon carbide, gallium arsenide, gallium phosphide, indium phosphide, indium arsenide, and/or indium antimonide; or combinations thereof. Furthermore, in certain embodiments, the semiconductor substrate 101 includes a semiconductor-on-insulator (SOI) structure. Also alternatively, the semiconductor substrate 101 includes a buried dielectric layer, such as a buried oxide (BOX) layer, such as that formed by separation by implantation of oxygen (SIMOX) technology, wafer bonding, SEG, or other appropriate method.

In some embodiments in accordance with the present disclosure, the semiconductor substrate 101 includes various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 101, in a P-well structure, in an N-well structure, in a dual-well structure, or using a raised structure. In certain embodiments, the semiconductor substrate 101 further includes various active regions, such as regions configured for an N-type metal-oxide-semiconductor transistor device and regions configured for a P-type metal-oxide-semiconductor transistor device.

In some embodiments in accordance with the present disclosure, the gate 110' shown in FIG. 1 includes a gate dielectric layer 109, a gate electrode layer 105, and a hard mask layer 106. The gate dielectric layer 109 comprises dielectric material, such as silicon oxide, silicon nitride, silicon oxynitride, high-k dielectric material, other suitable dielectric material, and/or combinations thereof. Examples of high-k dielectric material includes HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, or combinations thereof. The gate electrode layer 105 includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof.

In some embodiments in accordance with the present disclosure, the hard mask layer 106 is formed over the gate electrode layer 105. The hard mask layer 106 comprises any suitable material, for example, silicon nitride, SiON, SiC, SiOC, or other suitable material. It is understood that in certain embodiments, the gate 110' includes additional layers such as interfacial layers, capping layers, diffusion/barrier layers, dielectric layers, conductive layers, other suitable layers, and/or combinations thereof.

In some embodiments in accordance with the present disclosure, the gate 110' further includes a gate spacer 107. The gate spacers 107, which are positioned on each side of the gate 110' (i.e. on the sidewalls of the gate 110'), comprises a dielectric material, such as silicon nitride, silicon carbide, silicon oxynitride, other suitable materials, and/or combinations thereof. In some embodiments, the gate spacers 107 are used to offset subsequently formed doped regions, such as source/drain regions. In certain embodiments, the gate spacers 107 are further used for designing or modifying the source/drain region (junction) profile.

In some embodiments in accordance with the present disclosure, the epitaxial regrowth region 103 shown in FIG. 1 is adjacent to the gates 110'. In addition, the epitaxial regrowth region 103 is disposed on an interface 111 of the semiconductor substrate 101. The interface 111 is lower than the surface 101A. In certain embodiments, before the epitaxial regrowth region 103 is grown, the interface 111 is the bottom of a recess at the semiconductor substrate 101. The epitaxial regrowth region 103 is disposed at the recess and on the interface 111. Moreover, the epitaxial regrowth region 103 is configured to protrude from the recess and extend over the surface 101A. Accordingly, at least part of the epitaxial regrowth region 103 is in contact with the two gates 110' at two transverse ends of the epitaxial regrowth region 103.

In some embodiments in accordance with the present disclosure, the epitaxial regrowth region 103 includes a cap layer 113 and a bottom layer 115. The bottom layer is configured as a base for the cap layer 113. In certain embodiments, the bottom layer 115 is faceted so as to receive the cap layer 113. The bottom layer 115 is formed by cyclic deposition etch (CDE), and the cap layer 113 is formed by selective epitaxial growth (SEG). Accordingly, the activation of the cap layer 113 is lower than the activation of the bottom layer 115 by 1~20%.

In some embodiments in accordance with the present disclosure, a width of the bottom layer 115 is larger than the width of the cap layer 113. In other words, the width of the epitaxial regrowth region 103 below the surface 101A is larger than the width of the epitaxial regrowth region 103 above the surface 101A. In certain embodiments, the cap layer 113 is confined by the gates 110'. Accordingly, the width of the cap layer 113 is limited to no larger than the distance, along X direction, between two adjacent gates 110'.

In some embodiments in accordance with the present disclosure, a CDE is performed by introducing a continuous flow of one or more vapor-phase etchants into the processing chamber. The term "continuous" as used herein refers to a continued flow of one or more etchants during the entire selective deposition process (for example, $Cl_2$) while other reactants are started and stopped cyclically several times (for example, HCl). Such a continuous flow includes one or more etchants that flow throughout the selective deposition process. In some embodiments, one or more etchants are introduced intermittently throughout the process, while at least one other etchant is flowing at all times throughout the selective deposition process. In some embodiments, the silicon-containing source includes one or more of the following sources, silane ($SiH_4$), dichlorosilane or DCS ($SiCl_2H_2$), disilane ($Si_2H_6$), monochlorodisilane (MCDS), dichlorodisilane (DCDS), trisilane ($Si_3H_8$), or 2,2-dichlorotrisilane. The dopant source includes phosphine ($PH_3$) or arsine ($AsH_3$). In some embodiments, the bottom layer 115 includes phosphorous-doped or arsenic-doped silicon or silicon carbide for an nMOS structure. In some embodiments, the CDE is performed in an environment, in which the total pressure of gases may be between about 10 Torrs and about 600 Torrs, and the temperature may be between about 400 and about 800 degrees Celsius.

In some embodiments in accordance with the present disclosure, an SEG is performed by introducing growth gases such as $SiH_2Cl_2$, $SiH_4$, $Si_2H_6$ and MMS, doping gases $PH_3$ or $B_2H_6$, and etching gas selected from HCl, HF, $Cl_2$, and combinations thereof, to form a phosphor-doped or boron-doped silicon carbide top layer 113. Alternatively, the etching gas includes a gas selected from the group consisting essentially of $C_xF_yH_z$, $C_xCl_yH_z$, $Si_xF_yH_z$, $Si_xCl_yH_z$, with values x, y, and z represent the percentage of the respective elements. During the SEG, both growth and etch co-exist. In different epitaxy stages of the embodiments, the growth rate may be greater than or smaller than the etch rate, and hence the corresponding net effects may be growth or etching. In some embodiments, the SEG is performed using chemical vapor deposition in a chamber, in which the total pressure of gases may be between about 100 Torrs and about 600 Torrs, and the temperature may be between about 400 and about 800 degrees Celsius.

In some embodiments in accordance with the present disclosure, the bottom layer 115 is lower than the surface 101A and the gates 110'. In other words, the top of the bottom layer 115 is not higher than the surface 101A, i.e., where the gates 110' are disposed. In addition, the bottom layer 115 has a first downwardly-curved edge 1152 and a second downwardly-curved edge 1154. The second downwardly-curved edge 1154 is over the first downwardly-curved edge 1154 and has a curvature larger than the curvature of the first downwardly-curved edge 1154. Accordingly, the bottom layer 115 is in a substantially smiling shape, which is shorter in the middle and taller at two ends. In addition, the first and second downwardly-curved edges 1152, 1154 are connected at two endpoints 1156. The two endpoints 1156 represent the tallest part of the bottom layer 115, having a height H1 measuring from the lower surface of the bottom layer 115. The central point 1158 represents the lowest part of the bottom layer 115, having a height H2 measuring from the lower surface of the bottom layer 115. The height H1 is always higher than the height H2. In other words, the two endpoints 1156 is not lower than the central point 1158 of the second downwardly-curved edge 1154. The differences between the heights H1 and H2 varies depending on different growth conditions of the bottom layer 115.

In some embodiments in accordance with the present disclosure, the two endpoints 1156 do not protrude over the surface 101A. Accordingly, the two endpoints 1156 are configured to be not higher than the bottom of the gates 110'. In certain embodiments, the two endpoints 1156 are in contact with the surface 101A. Alternatively, the two endpoints 1156 are in contact with the bottom of the gates 110'. In other words, the bottom layer 115 does not protrude over the surface 101A, and the bottom layer 115 is covered by the cap layer 113. Moreover, the thickness of the cap layer 113 is different from thickness of the bottom layer 115. In some embodiments, the thickness ratio between the cap layer 113 and the bottom layer 115 is about 0.5 to about 2. Such thickness ratio serves to secure an isolation for the bottom layer 115 from being exposed to materials over cap layer 113 or the surface 101A.

In some embodiments in accordance with the present disclosure, the cap layer includes an upwardly-curved edge 1132 over a lower edge 1134. The lower edge 1134 is in contact with the bottom layer 115 and the lower edge 1134 is not higher than the endpoints 1156 of the bottom layer 115. The upwardly-curved edge 1132 represents the perimeter of the cap layer 113 protruding above the surface 101A. As depicted in FIG. 1, the upwardly-curved edge 1132 is steeper in slope ratio at two ends than that at the central portion. In addition, the two ends of the upwardly-curved edge 1132 at least partially contact and conform to the two gates 110'. Accordingly, no voids are left between the cap layer 113 and the gates 110' so as to expose the bottom layer 115. In certain embodiments, the cap layer 113 is grown along the gate spacers 107. Accordingly, the cap layer 113 is configured as an insulation between the bottom layer 115 and any material over the cap layer 113.

Figure 2:
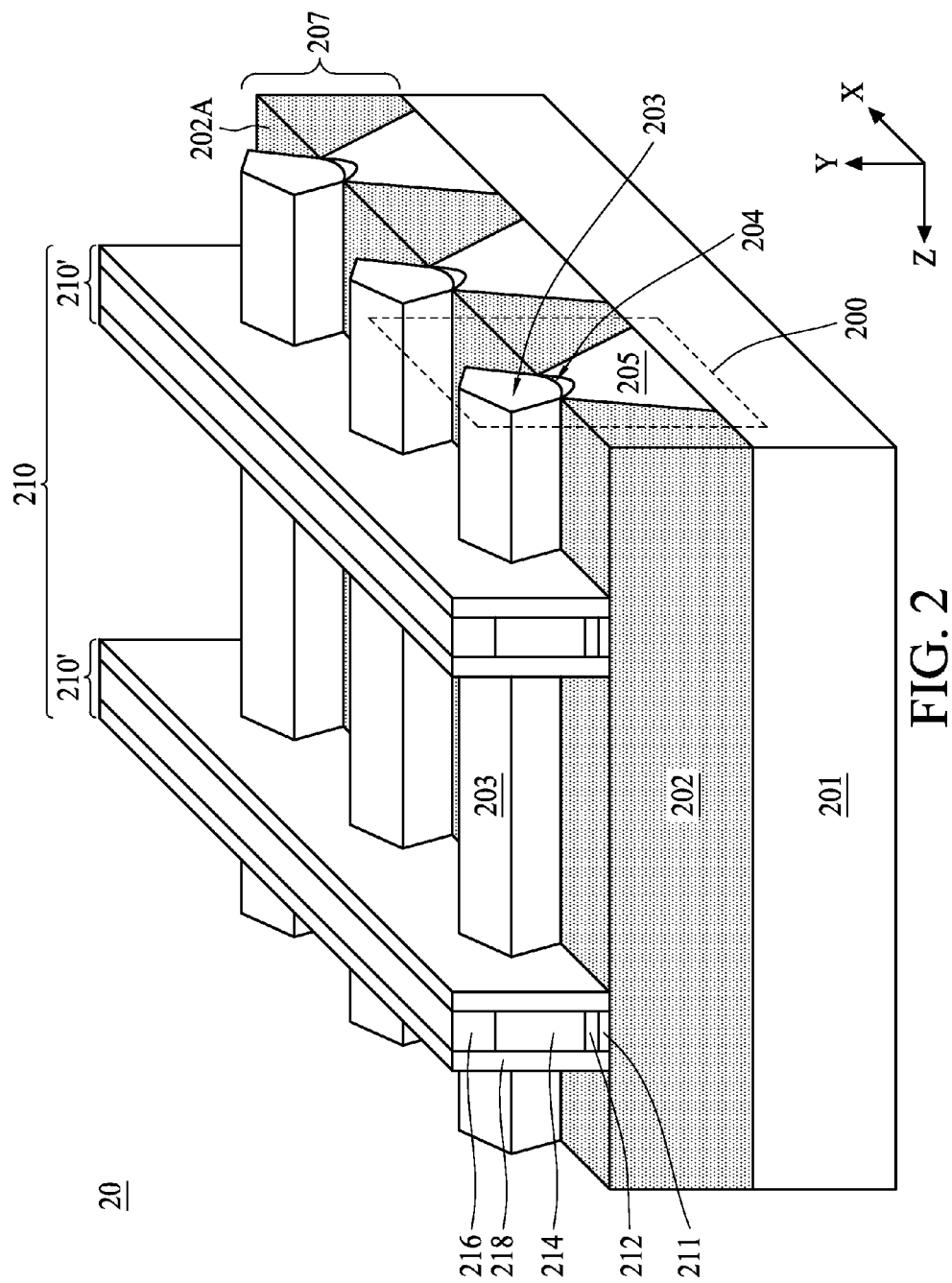
FIG. 2 is a perspective view of regrowth source/drain regions between two metal gates of a FinFET, in accordance with some embodiments of the present disclosure.

FIG. 2 is a perspective view of regrowth source/drain regions and their relative positions to a metal gate structure 210 of a FinFET 20.

In some embodiments in accordance with the present disclosure, the metal gate structure 210 includes two metal gates 210'. The FinFET 20 includes an insulating layer 202 having a top surface 202A and positioning on a semiconductor substrate 201. A semiconductor fin 207 is partially located in the insulating layer 202 and partially elevated from the top surface 202A of the insulating layer 202. The semiconductor fin 207 having a first region 205, cap layer 203 and bottom layer 204 are arranged along the Z direction. The bottom layer 204 is grown over the first region 205 by CDE, and the cap layer 203 is grown over the bottom layer 204 by SEG. The cap layer 203 possesses an activation lower that that of the bottom layer 204 by 1~20%. The cap layer 203 is configured over the bottom layer 204, and the bottom layer 204 is configured over the first region 205. The bottom layer 204 is not higher than the surface 202A. In other words, the highest parts of the bottom layer 204 at best reaches the bottom of the metal gate 210'. The two metal gates 210' are positioned in an orthogonal fashion (i.e along the X direction) over the semiconductor fin 207 and the insulating layer 202. In certain embodiments, the cap layer 203 protrudes over the surface 202A of the insulating layer 202 and extends along the metal gates 210'. In addition, since the cap layer 203 is formed by SEG, no voids are left between the cap layer 203, the insulating layer 202 and the metal gates 210' so as to expose the bottom layer 204.

Still referring to FIG. 2, in some embodiments in accordance with the present disclosure, the metal gates 201 includes an interfacial layer 211, a gate dielectric layer 212, a gate electrode layer 214, and a hard mask layer 216. It is understood that the metal gates 201 may comprise additional layers such as interfacial layers, capping layers, diffusion/barrier layers, dielectric layers, conductive layers, other suitable layers, and/or combinations thereof. The interfacial layer 211 is formed over the insulating layer 202, and the first region 205 of the semiconductor fin 207. In other words, the metal gate 210' is formed after the formation of the first region 205 of the semiconductor fin 207 but prior to an etch back and a regrowth of the bottom layer 204 and the cap layer 203. In certain embodiments, the first region 205 wrapped by the metal gate 210' (not shown in FIG. 2) may not possess a same surface contour as that of the bottom layer 204 or the cap layer 203.

As shown in FIG. 2, in some embodiments in accordance with the present disclosure, the metal gate 210' further includes a gate spacer 218. The gate spacers 218, which are positioned on each side of the gate stack (on the sidewalls of the metal gate 210'), may comprise a dielectric material, such as silicon nitride, silicon carbide, silicon oxynitride, other suitable materials, and/or combinations thereof. In some embodiments, the gate spacers 218 are used to offset subsequently formed doped regions, such as source/drain regions. The gate spacers 218 may further be used for designing or modifying the source/drain region (junction) profile.

Figure 3:
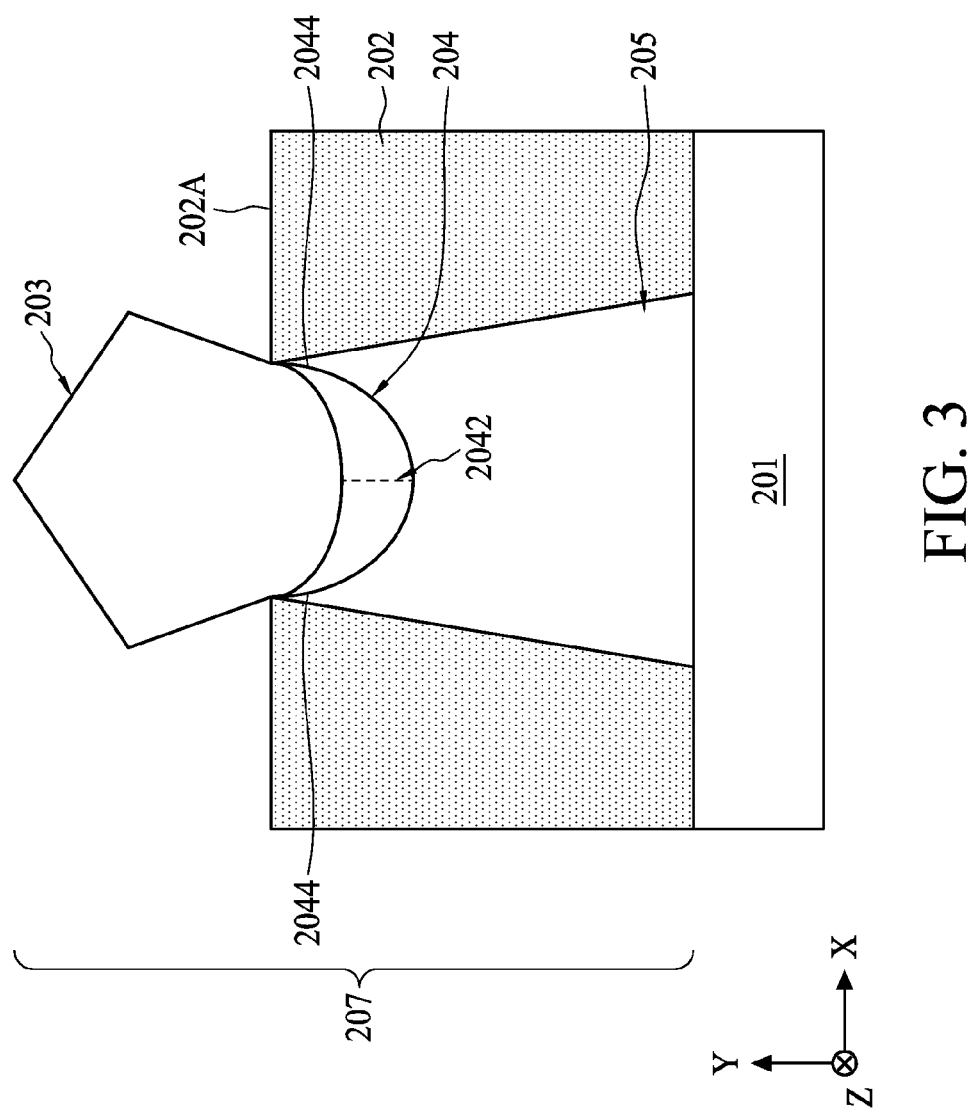
FIG. 3 is a cross sectional view of a regrowth source/drain region of a FinFET, in accordance with some embodiments of the present disclosure.

FIG. 3 is an enlarged view of a cross section of a semiconductor fin 207 framed by a dotted box 200 shown in FIG. 2. Identical numeral labels shown in FIG. 3 and FIG. 2 are referred to the same structural elements and is not repeated here for simplicity.

Referring to FIG. 3, in some embodiments in accordance with the present disclosure, the first region 205, the bottom layer 204 and the cap layer 203 of the semiconductor fin 207 is provided. The bottom layer 204 gradually reduces in dimension from a central line (represented by the dotted line 2042) of the bottom layer 204 to two endpoints 2044 at two ends of the bottom layer 204. A thickness of the bottom layer 204 is not larger than that of the insulating layer 202. In addition, the bottom layer 204 is upwardly-curved. Accordingly, the bottom portion 204 is substantially a smiling shape. Moreover, the thickness of the bottom layer 204 is different from thickness of the cap layer 203. In some embodiments, the thickness ratio between the cap layer 203 and the bottom layer 204 is about 0.5-2. Such thickness ratio serves to secure an isolation for the bottom layer 204 from being exposed to materials over cap layer 203 or the surface 202A.

In some embodiments in accordance with the present disclosure, during the formation of the semiconductor fin 207, the bottom layer 204 continues to be grown over the first region 205 until the endpoint 2044 reaches the surface 202A or the bottom of the metal gate (omitted). Accordingly, the bottom layer 204 does not protrude over the surface 202A. In addition, the cap layer 203 serves to provide isolation between the bottom layer 204 and any material over the cap layer 203 or the insulating layer 202. In other words, there are no voids between the cap layer 203 and the insulating layer 202 exposing the bottom layer 204. In certain embodiments, both the cap layer 203 and the insulating layer 202 are configured to cover and isolate the bottom layer 204 from any material over the cap layer 203 or the insulating layer 202.

Figure 4:
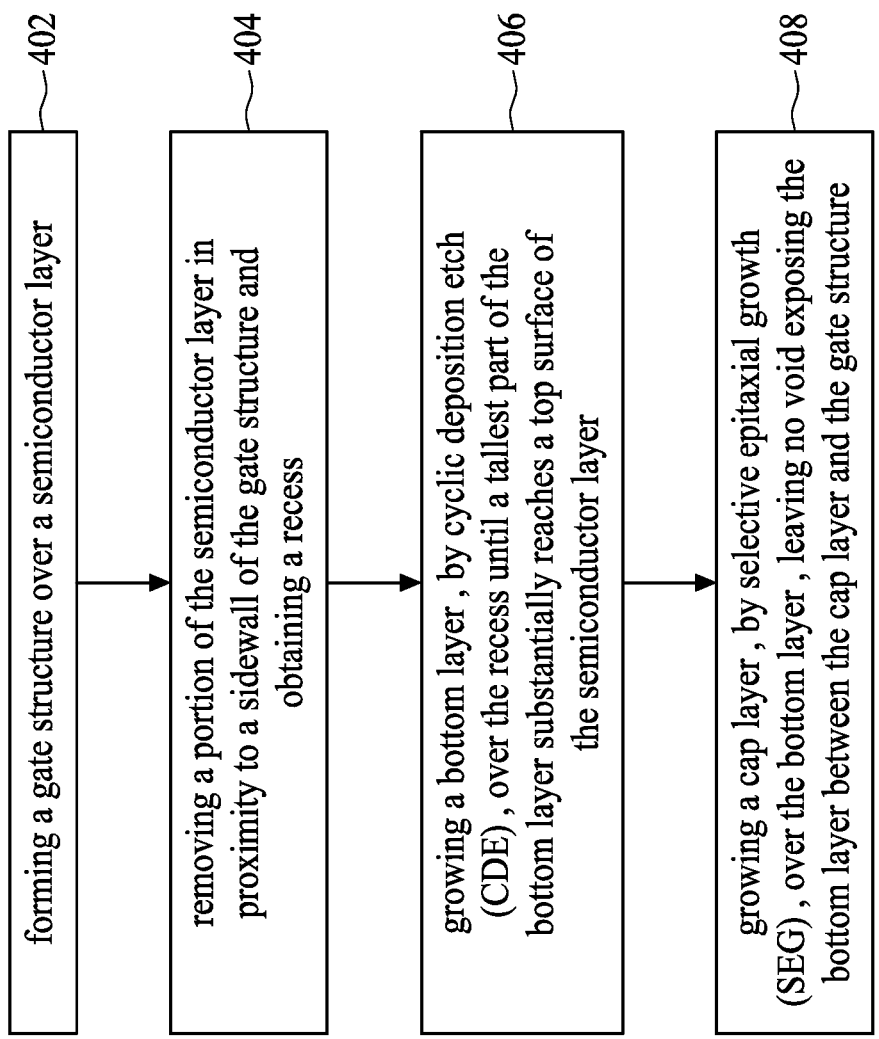
FIG. 4 is an operational flow of a method for manufacturing a semiconductor structure, in accordance with some embodiments of the present disclosure.

FIG. 4 is an operational flow of a method for manufacturing a semiconductor structure, in accordance with some embodiments of the present disclosure.

In operation 402, a gate structure is formed over a semiconductor layer having a top surface. In operation 404, a portion of the semiconductor layer that is close to a sidewall of the gate structure is removed and as a result, a recess is formed on the semiconductor layer. In operation 406, a bottom layer of an epitaxial regrowth region is formed by CDE in the recess. The bottom layer continues to be formed in the recess until a tallest part of the bottom layer reaches the top surface of the semiconductor layer. In operation 408, a cap layer of the epitaxial regrowth region is formed by SEG over the bottom layer. The cap layer is at least partially conformed to the gate structure so as to leave no void exposing the bottom layer between the cap layer and the gate structure. In certain embodiments, the cap layer is configured to protrude over the semiconductor layer.

FIGS. 5-10 are cross sectional views of an operation in a method for manufacturing a regrowth source/drain region between two gates of a planar transistor.

Figure 5:
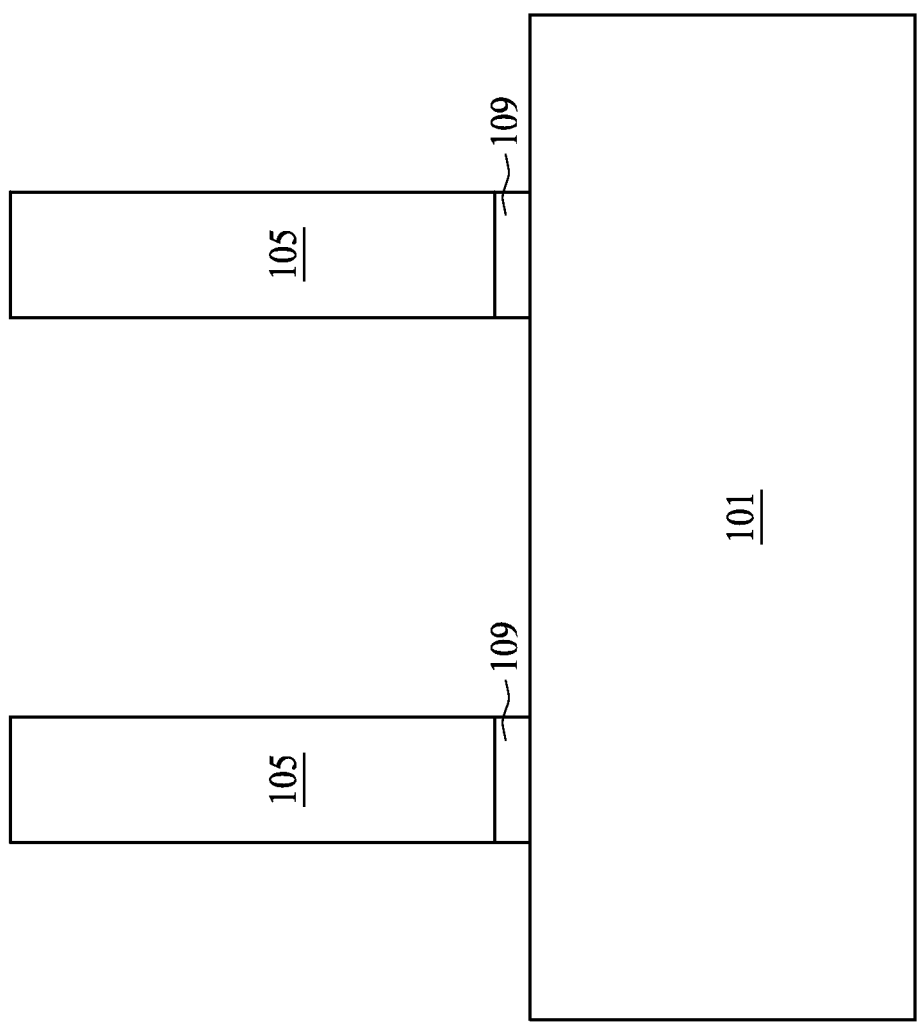
FIGS. 5-10 are cross sectional views of an operation in a method for manufacturing a regrowth source/drain region between two gates of a planar transistor, in accordance with some embodiments of the present disclosure.
Figure 6:
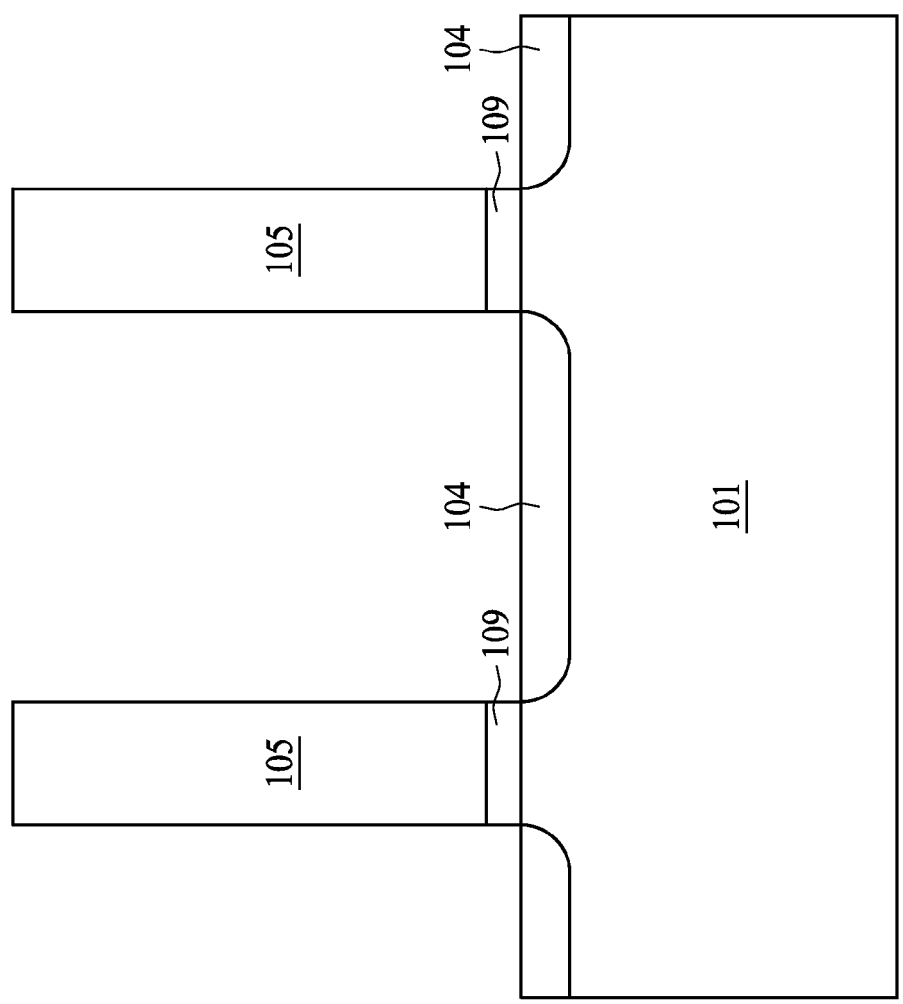
Figure 7:
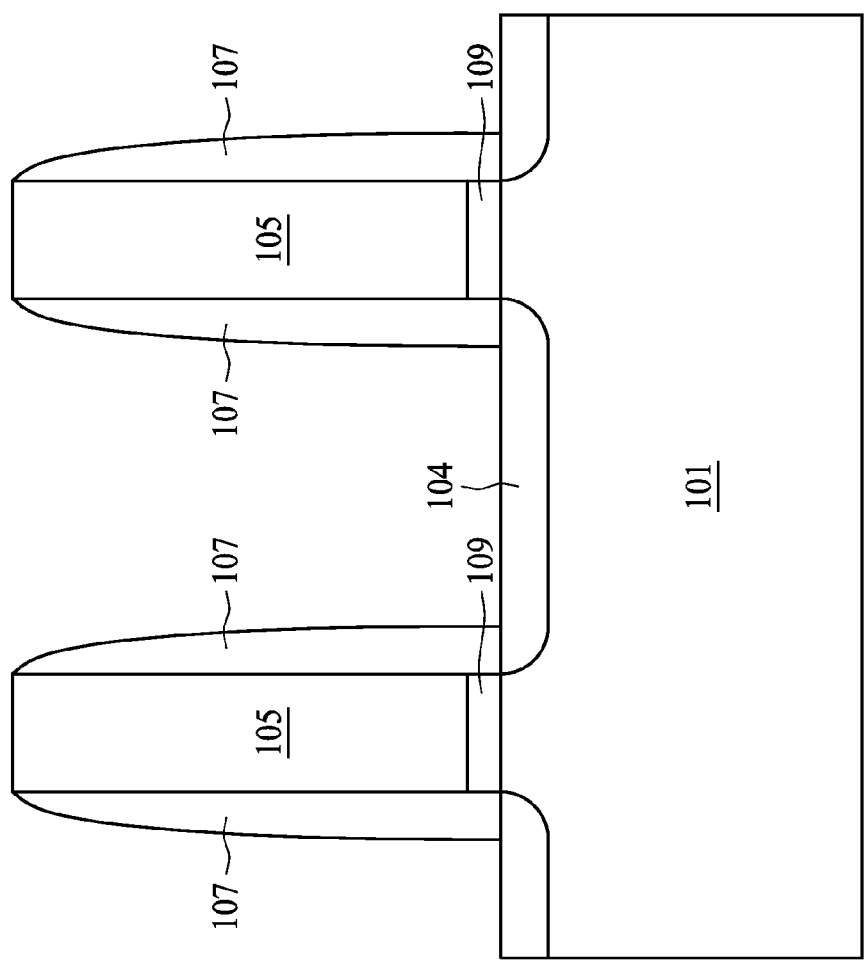

FIGS. 5-7 show operation 402 in which a gate structure is formed over a semiconductor layer or a semiconductor substrate 101. In some embodiments, the gate structure is a polysilicon gate over a planar transistor. In other embodiments, the gate structure is a metal gate over a FinFET. Identical numeral labels shown in the following figures and the figures previously discussed in the present disclosure referred to the same structural elements and are not repeated here for simplicity.

In FIG. 5, a gate electrode 105 and a gate dielectric 109 is formed by lithography operations on a semiconductor substrate 101. The gate electrode 105 can be formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof.

In FIG. 6, lightly doped drain/source (LDD) regions 104 are formed, for example, by implanting a n-type impurity. Gate electrodes 105 act as masks so that an inner edges of LDD regions 104 are substantially aligned with the edges of gate electrodes 105, respectively.

In FIG. 7, gate spacers 107 may be formed using commonly used techniques, such as plasma enhanced chemical vapor deposition (PECVD), low-pressure chemical vapor deposition (LPCVD), sub-atmospheric chemical vapor deposition (SACVD), or the like. The formation of gate spacers 107 may include blanket forming gate spacer layers, and then performing etching steps to remove the horizontal portions of the gate spacer layers which lie upon a top surface of the gate electrode 105, so that the remaining vertical portions of the gate spacer layers form gate spacers 107.

Figure 8:
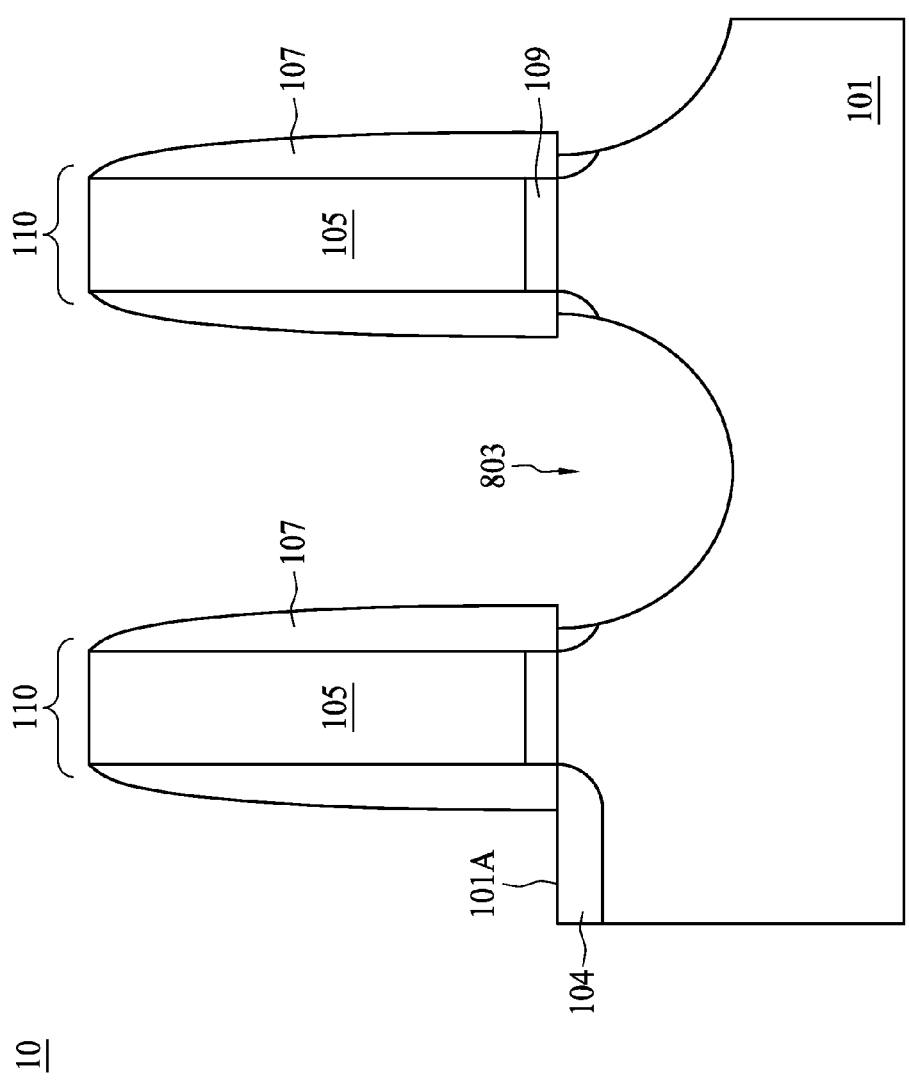

FIG. 8 shows operation 404 in which a portion of the semiconductor layer or a semiconductor substrate 101 in proximity to a sidewall of the gate structure is removed thus to obtain a recess 803. Any suitable amount of material may be removed from the semiconductor layer or a semiconductor substrate 101. However, the amount removed can be tailored by controlling etching conditions, that is, the depth of the recess 803 is controllable by applying different etchant at various etching conditions. The removing operation 404 may include forming a photoresist layer or a capping layer (such as an oxide capping layer) over the planar transistor shown in FIG. 7, patterning the photoresist or capping layer to have openings that expose the S/D regions of the planar transistor, and etching back material from the first semiconductor layer or the semiconductor substrate 101. In the depicted embodiment, the planar transistor is etched by a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet another alternative, the lithography process could implement nanoimprint technology.

Figure 9:
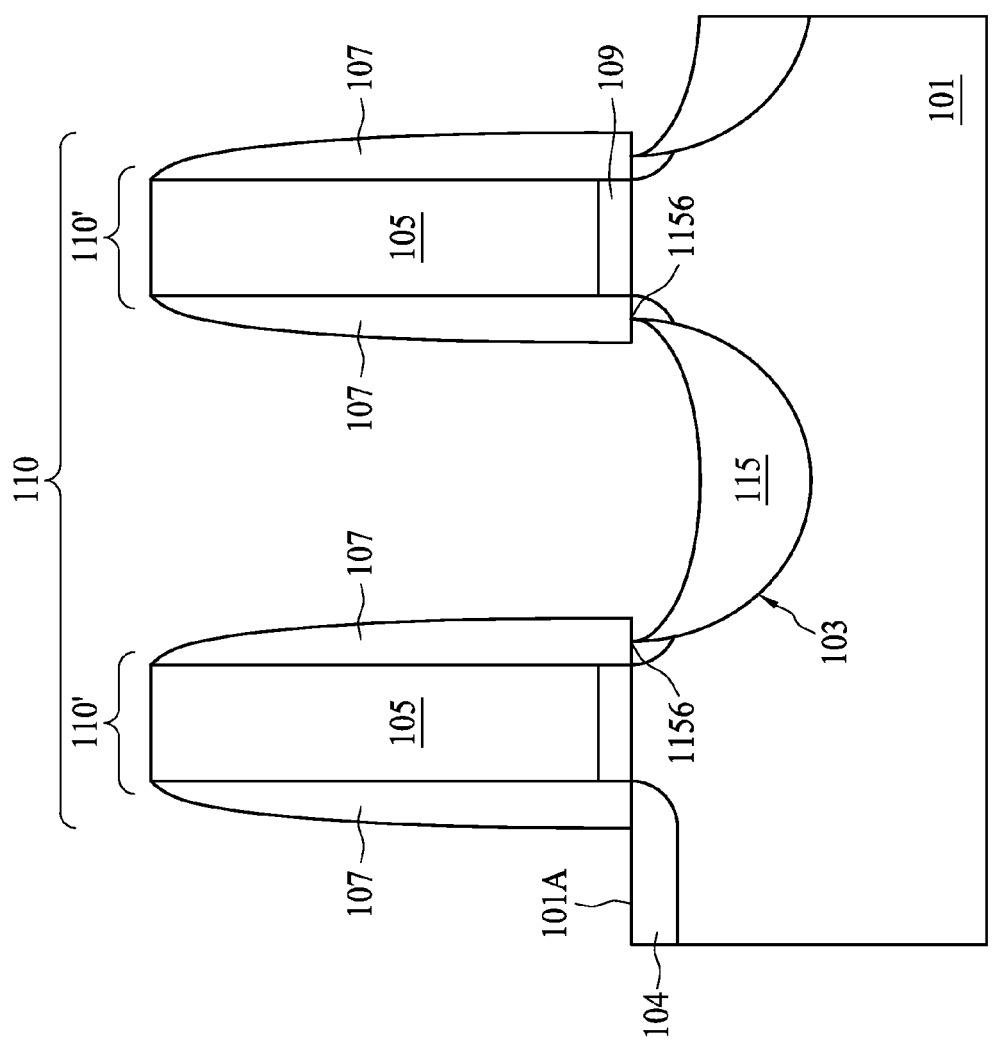

FIG. 9 shows operation 406 in which a bottom layer 115 of an epitaxial regrowth region 103 is formed in the recess. The bottom layer 115 is formed over the S/D regions of the planar transistor. The bottom layer 115 may be formed by one or more epitaxy or epitaxial (epi) processes, such as phosphor-doped or boron-doped silicon regrowth layer, SiGe regrowth layer, SiC regrowth layer, phosphor-doped or boron-doped SiC regrowth layer, pseudocubic $Si_3P_4$ regrowth layer, and/or other suitable regrowth layer that can be formed in a crystalline state on the planar transistor. The epitaxy process may use gaseous and/or liquid precursors, which interact with the composition of the semiconductor layer or the semiconductor substrate 101 of the planar transistor.

In some embodiments in accordance with the present disclosure, the bottom layer 115 is formed by cyclic deposition etch (CDE). The bottom layer 115 started to be formed and accumulate depth in the recess. The bottom layer 115 continues to be formed until a tallest part of the bottom layer 115 reaches the surface 101A of the semiconductor substrate 101, which is also the bottom of the gate structure 110. Accordingly, except for the endpoints 1156, the rest of the bottom layer 115 is lower than the surface 101A. Moreover, the bottom layer 115 substantially conforms to the dimension of the recess and therefore possesses a smiling shape. In addition, the bottom layer 115 is not thicker than the semiconductor layer or semiconductor substrate 101.

In some embodiments in accordance with the present disclosure, the CDE of the bottom layer 115 is conducted under a condition of total pressure of gasses between about 10 Torrs and about 600 Torrs, and a temperature between about 400 degrees Celsius and about 800 degrees Celsius. In certain embodiments, the bottom layer 115 is formed using $PH_3$ as phosphor precursor and at least one of $SiH_2Cl_2$, $SiH_4$, $Si_2H_6$ as silicon precursors. The $PH_3$ flow rate is from about 100 to about 400 SCCM, and the total flow rate for the silicon precursors is from about 100 to about 500 SCCM. In some embodiments, the bottom layer 115 is formed by a growth rate of about 1 A/s to about 30 A/s, and with a ratio of growth rate/etch rate of about 1 to about 50.

Figure 10:
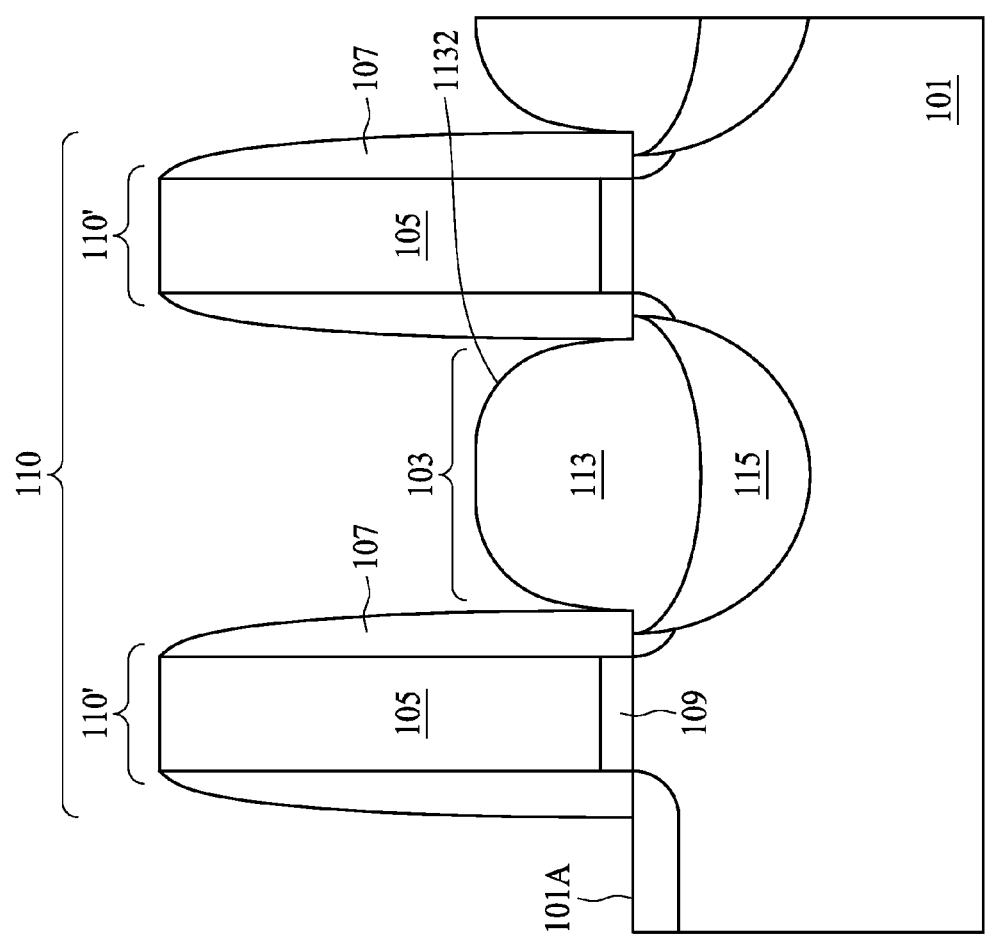

FIG. 10 shows operation 408 in which a cap layer 113 of the epitaxial regrowth region 103 is formed. The cap layer 113 is formed over the bottom layer 115 by selective epitaxial growth (SEG). In some embodiments, the cap layer 113 is formed on the faceted upper surface of the bottom layer 115. In addition, the cap layer 115 protrudes over the surface 101A and possesses an upwardly-curved edge 1132. The two sides of the upwardly-curved edge 1132 are steeper than the middle. Accordingly, at least part of the upwardly-curved edge 1132 conforms to the gates 110', leaving no voids exposing the bottom layer 115. In other words, the cap layer 113 is configured as an insulation between the bottom layer 115 and any material over the cap layer 113.

In some embodiments in accordance with the present disclosure, the SEG of the cap layer 113 is conducted under a condition of total pressure of gasses between about 100 Torrs and about 600 Torrs, and a temperature between about 400 degrees Celsius and about 800 degrees Celsius. In certain embodiments, the bottom layer 115 is formed by a growth rate of about 1 A/s to about 30 A/s, and with a ratio of growth rate/etch rate of about 1 to about 50.

Figure 11:
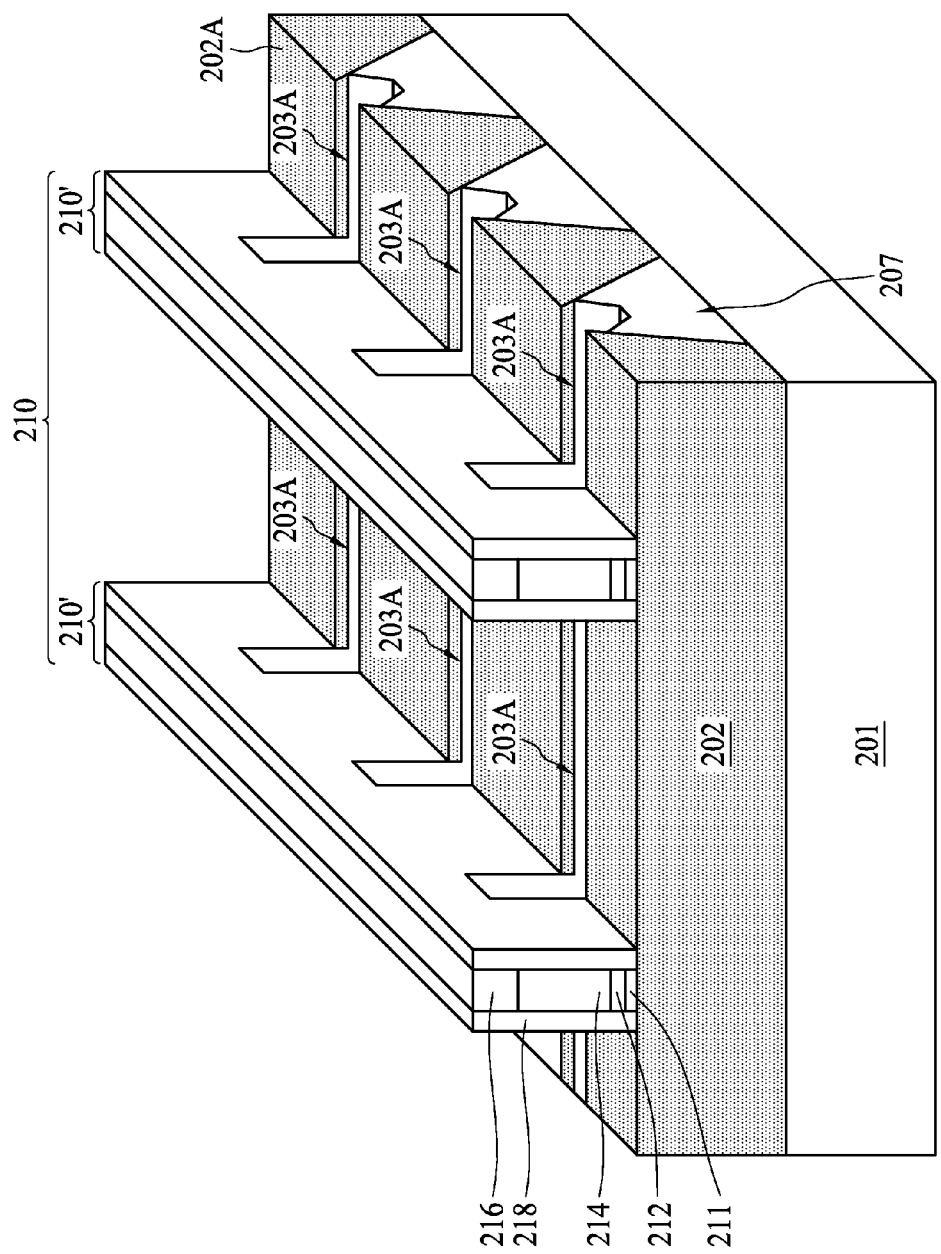
FIGS. 11-12 are perspective views of an operation in a method for manufacturing a regrowth source/drain region in a FinFET, in accordance with some embodiments of the present disclosure.

Referring to FIG. 11, the removing operation 404 is illustrated on a FinFET. Identical numeral labels shown in FIG. 11, FIG. 3, and FIG. 2 are referred to the same structural elements and is not repeated here for simplicity.

In FIG. 11, recesses 203A are formed by etching the original semiconductor fin 207 isotropically or anisotropically by photolithography operations. The portion of the semiconductor fin 207 wrapped by the gate 210' is not removed in the removing operation 404 discussed herein due to the presence of the hard mask layer 216 and additional photoresist layer (not shown) patterned on the gate 210', protecting the gate 210' and thus the wrapped semiconductor fin 207 from the attack of the etchants.

Figure 12:
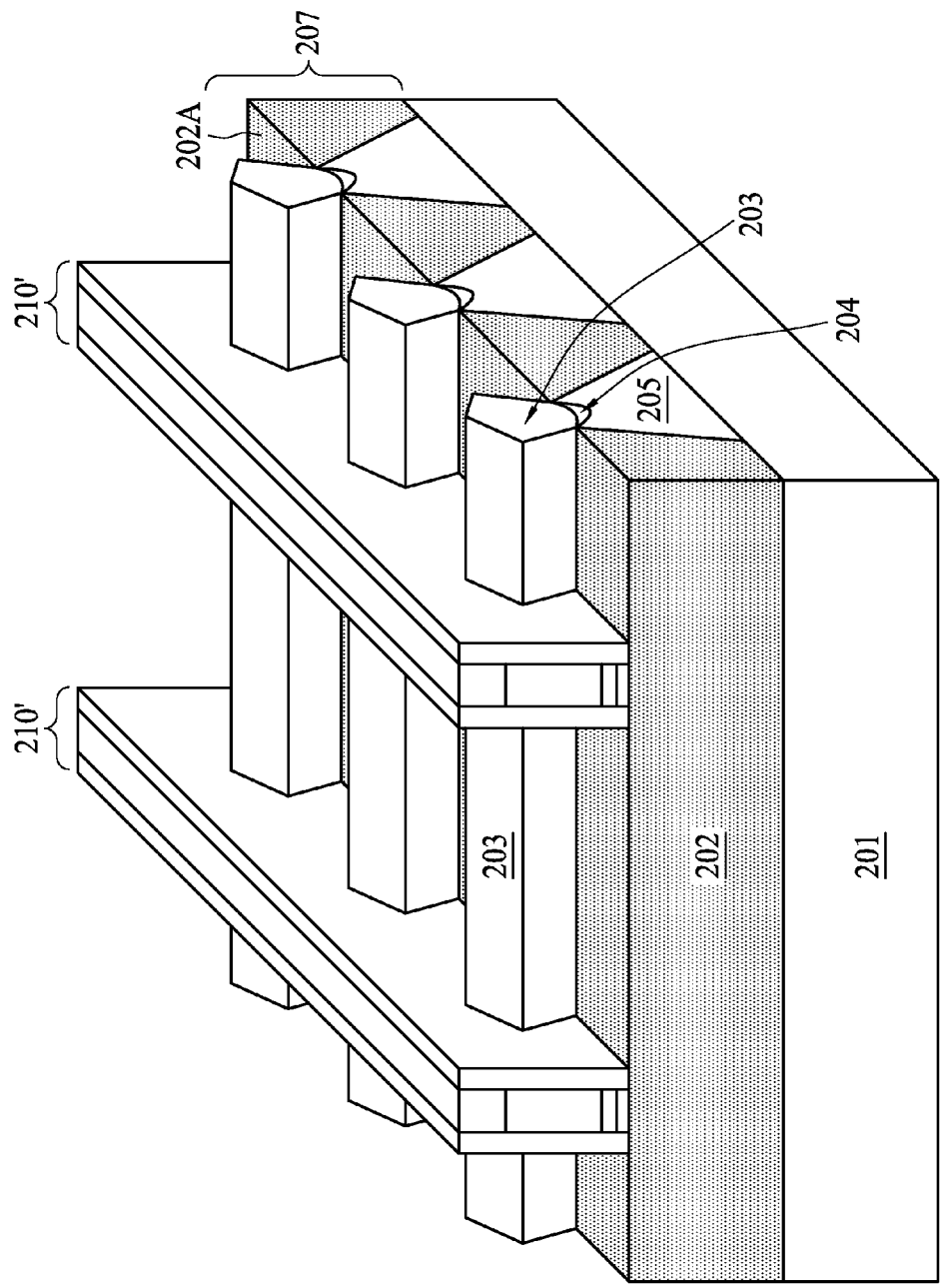

In subsequent operations, as shown in FIG. 12, bottom layer 204 is epitaxially grown in recesses 203A by a cyclic deposition etch (CDE), and the cap layer 203 is epitaxially grown over the bottom layer 204 by a selective epitaxial growth (SEG). The methods for performing the CDE and the SEG, and the characteristics and relationships between the cap layer 203, the bottom layer 204, the insulating layer 202 and the gates 210' are described in the previous disclosures and will not be repeated. In some embodiments in accordance with the present disclosure, Some embodiments of the present disclosure provide a semiconductor structure with a semiconductor substrate including a surface. A gate structure is provided on the surface. The semiconductor substrate includes an interface lower than the surface for supporting an epitaxial regrowth region. The epitaxial regrowth region is adjacent to the gate structure and extends from the interface over the surface. In addition, the epitaxial regrowth region includes a bottom layer and a cap layer over the bottom layer. The activation of the cap layer is lower than that of the bottom layer. Moreover, the bottom layer is configured lower than the surface and the gate structure. The bottom layer includes a first downwardly-curved edge and a second downwardly-curved edge over the first one. The first downwardly-curved edge is connected with the second downwardly-curved edge at two endpoints. Furthermore, the two endpoints are in contact with the surface of the semiconductor substrate.

In some embodiments in accordance with the present disclosure, the activation of the cap layer is lower than that of the bottom layer by 1~20%.

In some embodiments in accordance with the present disclosure, the cap layer includes an upwardly-curved edge and a lower edge. The upwardly-curved edge is over the lower edge. The lower edge is in contact with the bottom layer. The upwardly-curved edge is steeper in slope ratio at two ends than that at a central portion. In addition, the cap layer is configured as an insulation between the bottom layer and any material over the cap layer.

In some embodiments in accordance with the present disclosure, the curvature of the first downwardly-curved edge is smaller than that of the second downwardly-curved edge.

In some embodiments in accordance with the present disclosure, the endpoints of the bottom layer are not lower than a central point of the second downwardly-curved edge of the bottom layer.

In some embodiments in accordance with the present disclosure, the cap layer includes a lower edge, and the lower edge is not higher than the endpoints of the bottom layer.

In some embodiments in accordance with the present disclosure, the cap layer has a width smaller than that of the bottom layer.

In some embodiments in accordance with the present disclosure, the bottom layer is faceted and configured to receive the cap layer.

Some embodiments of the present disclosure provide a semiconductor structure including an insulating layer positioned on a semiconductor substrate. The insulating layer includes a top surface. A semiconductor fin is partially located in the insulating layer and positioned on the semiconductor substrate. A metal gate is disposed over the semiconductor fin and the insulating layer. The semiconductor fin includes a bottom layer and a cap layer over such bottom layer. The activation of the cap layer is lower than that of the bottom layer. Moreover, the bottom layer gradually reduces in dimension from a central line thereof to two endpoints at two ends thereof. In addition, the bottom layer is covered by the cap layer and the insulating layer.

In some embodiments in accordance with the present disclosure, the activation of the cap layer is lower than that of the bottom layer by 1~20%.

In some embodiments in accordance with the present disclosure, the cap layer is configured to protrude from the insulating layer and extend along the metal gate. Accordingly, there is no void between the cap layer and the metal gate exposing the bottom layer.

In some embodiments in accordance with the present disclosure, the bottom layer is substantially a smiling shape.

In some embodiments in accordance with the present disclosure, a thickness of the bottom layer is not larger than that of the insulating layer. In other words, the bottom layer is not thicker than the insulating layer.

Some embodiments of the present disclosure provide a method for manufacturing a semiconductor structure. In one operation, a gate structure is formed over a semiconductor layer. In one operation, a portion of the semiconductor layer in proximity to a sidewall of the gate structure is removed. Accordingly, a recess at the semiconductor layer in proximity to a sidewall of the gate structure is obtained. In one operation, a bottom layer is grown over the recess by cyclic deposition etch (CDE). The bottom layer continues to be grown until a tallest part of the bottom layer substantially reaches a top surface of the semiconductor layer. In one operation, a cap layer is grown over the bottom layer by selective epitaxial growth (SEG). The cap layer is grown so as to leave no void exposing the bottom layer between the cap layer and the gate structure.

In some embodiments in accordance with the present disclosure, in one operation, the bottom layer is grown until the tallest part of the bottom layer reaches a bottom of the gate structure.

In some embodiments in accordance with the present disclosure, the CDE of the bottom layer is conducted under a condition of total pressure of gasses between about 10 Torrs and about 600 Torrs, and a temperature between about 400 degrees Celsius and about 800 degrees Celsius. Moreover, the SEG of the cap layer is conducted under a condition of total pressure of gasses between about 100 Torrs and about 600 Torrs, and a temperature between about 400 degrees Celsius and about 800 degrees Celsius.

In some embodiments in accordance with the present disclosure, the bottom layer is formed by a growth rate of about 1 Å/s to about 30 Å/s. In addition, the cap layer is formed by a growth rate of about 1 Å/s to about 30 Å/s.

In some embodiments in accordance with the present disclosure, the bottom layer is grown with a ratio of growth rate/etch rate of about 1 to about 50. In addition, the cap layer is grown with an E/D ratio of about 0.01 to about 0.3. The E/D ratio is the ratio of the HCl flow rate/Silicon source precursor flow rate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate including a surface;
   a gate structure on the surface, contacting the surface with a bottom surface thereof, the gate structure comprising a gate electrode and a gate spacer surrounding the gate electrode; and
   an epitaxial regrowth region adjacent to the gate structure, comprising: a bottom layer and a cap layer over the bottom layer, an intersection of the cap layer and the gate spacer forming a gate corner,
   wherein the cap layer possesses a lower activation than the bottom layer, and the bottom layer is lower than the surface and the gate structure and comprises a first downwardly-curved edge and a second downwardly-curved edge over the first downwardly-curved edge, and the first downwardly-curved edge is connected with the second downwardly-curved edge at two endpoints, wherein the two endpoints are in contact with the surface of the semiconductor substrate and setting back from the gate corner toward the gate electrode.

2. The semiconductor structure according to claim 1, wherein the activation of the cap layer is lower than that of the bottom layer by about 1% to about 20%.

3. The semiconductor structure according to claim 1, wherein a thickness ratio between the cap layer and the bottom layer is about 0.5 to about 2.

4. The semiconductor structure according to claim 1, wherein the first downwardly-curved edge has a curvature smaller than that of the second downwardly-curved edge.

5. The semiconductor structure according to claim 1, wherein the endpoints are not lower than a central point of the second downwardly-curved edge.

6. The semiconductor structure according to claim 1, wherein a lower edge of the cap layer is not higher than the endpoints of the bottom layer.

7. The semiconductor structure according to claim 1, wherein a width of the cap layer is smaller than that of the bottom layer.

8. The semiconductor structure according to claim 1, wherein the bottom layer is faceted and configured to receive the cap layer.

9. A semiconductor structure, comprising:
a semiconductor substrate including a surface;
a gate structure on the surface; and
an epitaxial regrowth region adjacent the gate structure disposed on an interface lower than the surface and extended over the surface, wherein the epitaxial regrowth region comprises: a bottom layer and a cap layer over the bottom layer,
wherein the cap layer possesses a lower activation than the bottom layer, and the bottom layer is lower than the surface and the gate structure and comprises a first downwardly-curved edge and a second downwardly-curved edge over the first downwardly-curved edge, and the first downwardly-curved edge is connected with the second downwardly-curved edge at two endpoints,
wherein the two endpoints are in contact with the surface of the semiconductor substrate,
wherein the cap layer comprises an upwardly-curved edge over a lower edge and the lower edge is in contact with the bottom layer, and
wherein the upwardly-curved edge is steeper in slope ratio at two ends than that at a central portion,
wherein the cap layer is configured as insulation between the bottom layer and any material over the cap layer.

10. A semiconductor structure, comprising:
an insulating layer including a top surface, positioning on a semiconductor substrate;
a semiconductor fin partially located in the insulating layer, positioning on the semiconductor substrate; and
a metal gate over the semiconductor fin and the insulating layer,
wherein the semiconductor fin comprises:
a bottom layer; and
a cap layer over the bottom layer,
wherein the bottom layer gradually reduces in a vertical dimension from a central line of the bottom layer to two endpoints at two ends of the bottom layer,
wherein the bottom layer is covered by the cap layer and the insulating layer, and
wherein the two endpoints are in contact with the top surface.

11. The semiconductor structure according to claim 10, wherein an activation of the cap layer is lower than that of the bottom layer by about 1% to about 20%.

12. The semiconductor structure according to claim 10, wherein a thickness ratio between the cap layer and the bottom layer is about 0.5 to about 2.

13. The semiconductor structure according to claim 10, wherein the cap layer protrudes from the insulating layer and extends along the metal gate and leaves no void exposing the bottom layer.

14. The semiconductor structure according to claim 10, wherein the bottom layer is substantially a smiling shape.

15. The semiconductor structure according to claim 10, wherein a thickness of the bottom layer is not larger than that of the insulating layer.

16. A semiconductor structure, comprising:
a semiconductor substrate having a top surface;
a gate structure on the top surface, the gate structure comprising a gate electrode and a gate spacer surrounding the gate electrode;
a raised regrowth structure partially disposed in the semiconductor substrate, the raised regrowth structure comprising a bottom layer and a cap layer over the bottom layer, an intersection of the cap layer, an extension of the top surface toward the cap layer, and the gate spacer forming a gate corner,
wherein the bottom layer is lower than the top surface, comprising a first downwardly-curved edge and a second downwardly-curved edge over the first downwardly-curved edge, and the first downwardly-curved edge is connected with the second downwardly-curved edge at two endpoints,
wherein the two endpoints are in contact with the top surface of the semiconductor substrate under the gate structure and setting back from the gate corner toward the gate electrode.

17. The semiconductor structure of claim 16, wherein the gate structure is a metal gate.

18. The semiconductor structure of claim 16, wherein the semiconductor substrate includes a fin structure and the raised regrowth structure is partially disposed in the fin structure.

19. The semiconductor structure of claim 16, wherein a thickness ratio between the cap layer and the bottom layer is in a range of from about 0.5 to about 2.

20. The semiconductor structure of claim 16, wherein a second downwardly-curved edge is lower than the endpoints.

* * * * *